(12) United States Patent
Lendvay

(10) Patent No.: US 11,830,867 B2
(45) Date of Patent: Nov. 28, 2023

(54) MEMORY DEVICE WITH A MULTIPLEXED COMMAND/ADDRESS BUS

(71) Applicant: Micron Technology, Inc., Boise, ID (US)

(72) Inventor: William A. Lendvay, Boise, ID (US)

(*) Notice: Subject to any disclaimer, the term of this patent is extended or adjusted under 35 U.S.C. 154(b) by 0 days.

(21) Appl. No.: 17/856,354

(22) Filed: Jul. 1, 2022

(65) Prior Publication Data

US 2022/0336435 A1 Oct. 20, 2022

Related U.S. Application Data

(63) Continuation of application No. 17/143,120, filed on Jan. 6, 2021, now Pat. No. 11,380,667, which is a (Continued)

(51) Int. Cl.
*H01L 25/18* (2023.01)
*G06F 13/16* (2006.01)
(Continued)

(52) U.S. Cl.
CPC ............... *H01L 25/18* (2013.01); *G06F 1/30* (2013.01); *G06F 3/065* (2013.01); *G06F 3/0619* (2013.01); *G06F 3/0685* (2013.01); *G06F 11/2094* (2013.01); *G06F 13/1689* (2013.01); *G06F 13/4072* (2013.01); *G11C 5/04* (2013.01); *G11C 5/063* (2013.01); *G11C 11/4093* (2013.01); *G11C 11/4096* (2013.01); *G06F 2201/805* (2013.01)

(58) Field of Classification Search
CPC .... G06F 13/1689; G06F 1/30; G06F 11/2094; G06F 3/0685; G06F 3/0619; G06F 13/4072; G06F 3/065; G06F 2201/805; G11C 11/4093
See application file for complete search history.

(56) References Cited

U.S. PATENT DOCUMENTS 6,480,929 B1 11/2002 Gauthier et al.
9,460,791 B1 10/2016 Shallal et al.
(Continued)

FOREIGN PATENT DOCUMENTS

DE 102017100584 A1 7/2017
WO 2008121559 A1 10/2008

OTHER PUBLICATIONS

EP Patent Application No. 18834721.5—Extended European Search Report, dated Mar. 19, 2021, 7 pages.
(Continued)

*Primary Examiner* — Ajay Ojha
(74) *Attorney, Agent, or Firm* — Holland & Hart LLP

(57) ABSTRACT

A memory device includes a first plurality of volatile memories, a non-volatile memory, and a controller coupled to the non-volatile memory and including a first controller output. The memory device further includes a registering clock driver (RCD) including a first RCD output, and a first multiplexer including a first mux input coupled to the first RCD output, a second mux input coupled to the first controller output, and a first mux output coupled to the first plurality of volatile memories. The first multiplexer can be configured to provide command/address signals from one of the RCD and the controller to the first plurality of volatile memories.

19 Claims, 8 Drawing Sheets

Related U.S. Application Data continuation of application No. 16/016,111, filed on Jun. 22, 2018, now Pat. No. 10,930,632, which is a continuation of application No. 15/656,895, filed on Jul. 21, 2017, now Pat. No. 10,147,712.

(51) Int. Cl.
| *G06F 13/40* | (2006.01) |
| *G11C 11/4093* | (2006.01) |
| *G06F 3/06* | (2006.01) |
| *G06F 11/20* | (2006.01) |
| *G06F 1/30* | (2006.01) |
| *G11C 5/04* | (2006.01) |
| *G11C 11/4096* | (2006.01) |
| *G11C 5/06* | (2006.01) |

(56) References Cited

U.S. PATENT DOCUMENTS

| 9,817,610 | B1 | 11/2017 | Shallal et al. |
| 10,147,712 | B1 | 12/2018 | Lendvay |
| 10,930,632 | B2 | 2/2021 | Lendvay |
| 2008/0170433 | A1 | 7/2008 | Yamada |
| 2010/0115191 | A1 | 5/2010 | Hampel et al. |
| 2013/0145081 | A1 | 6/2013 | Miura et al. |
| 2014/0365715 | A1 | 12/2014 | Lee |
| 2016/0350002 | A1 | 12/2016 | Vergis et al. |
| 2017/0075576 | A1 | 3/2017 | Cho |
| 2017/0200498 | A1 | 7/2017 | Shallal et al. |
| 2017/0206028 | A1 | 7/2017 | O et al. |
| 2017/0206165 | A1 | 7/2017 | Lim |
| 2017/0277464 | A1 | 9/2017 | Yoon |
| 2017/0338213 | A1 | 11/2017 | Lalam et al. |
| 2017/0344051 | A1* | 11/2017 | Patel ............... G06F 1/10 |
| 2017/0365327 | A1 | 12/2017 | Kim et al. |
| 2018/0232171 | A1* | 8/2018 | Berke ............... G06F 13/16 |
| 2019/0026238 | A1 | 1/2019 | Lendvay |
| 2021/0125977 | A1 | 4/2021 | Lendvay |

OTHER PUBLICATIONS

International Application No. PCT/US2018/034553—International Search Report and Written Opinion, dated Dec. 26, 2018, 18 pages.
KR Patent Application No. 10-2019-7037413—Korean Office Action and Search Report, dated Feb. 15, 2021, with English Translation, 12 pages.
TW Patent Application No. 107120269—Taiwanese Office Action and Search Report, dated Jan. 17, 2019, with English Translation, 7 pages.
CN Patent Application No. 201880033462.X—Chinese Office Action and Search Report, dated Oct. 27, 2022, with English Translation, 35 pages.

\* cited by examiner

MEMORY DEVICE WITH A MULTIPLEXED COMMAND/ADDRESS BUS

CROSS-REFERENCE TO RELATED APPLICATION(S)

This application is a continuation of U.S. application Ser. No. 17/143,120, filed Jan. 6, 2021; which is a continuation of U.S. application Ser. No. 16/016,111, filed Jun. 22, 2018, now U.S. Pat. No. 10,930,632; which is a continuation of U.S. application Ser. No. 15/656,895, filed Jul. 21, 2017, now U.S. Pat. No. 10,147,712; each of which is incorporated herein by reference in its entirety.

TECHNICAL FIELD

The present disclosure generally relates to memory devices, and more particularly relates to memory devices with multiplexed command/address busses.

BACKGROUND

Memory devices may be provided as modules with standard physical formats and electrical characteristics to facilitate easier installation and deployment across multiple systems. One such module is a dual in-line memory module (DIMM), which is frequently used to provide volatile memory such as DRAM to computing systems. Although DRAM can be fast, and therefore well-suited to use as the main memory of computing systems, it is a volatile memory format and thus requires the continuous application of power to maintain the data stored therein. To address this limitation, other modules can provide both volatile memory (for use as the main memory of a system) and non-volatile memory (for backing up the volatile memory in case of power loss) in a single module. One such module is a non-volatile dual in-line memory module (NVDIMM).

NVDIMMs require more complex circuitry than is provided on a DIMM, in order to handle the additional tasks an NVDIMM may be called upon to perform (e.g., power loss detection, backup and restore operations, etc.). The additional circuitry can make the design of an NVDIMM more challenging, especially as the capacity (and therefore the number of memory chips) of the modules increases and the electrical characteristics to which the module must conform to meet the demands of a standard format grow ever more stringent.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Figure 1:
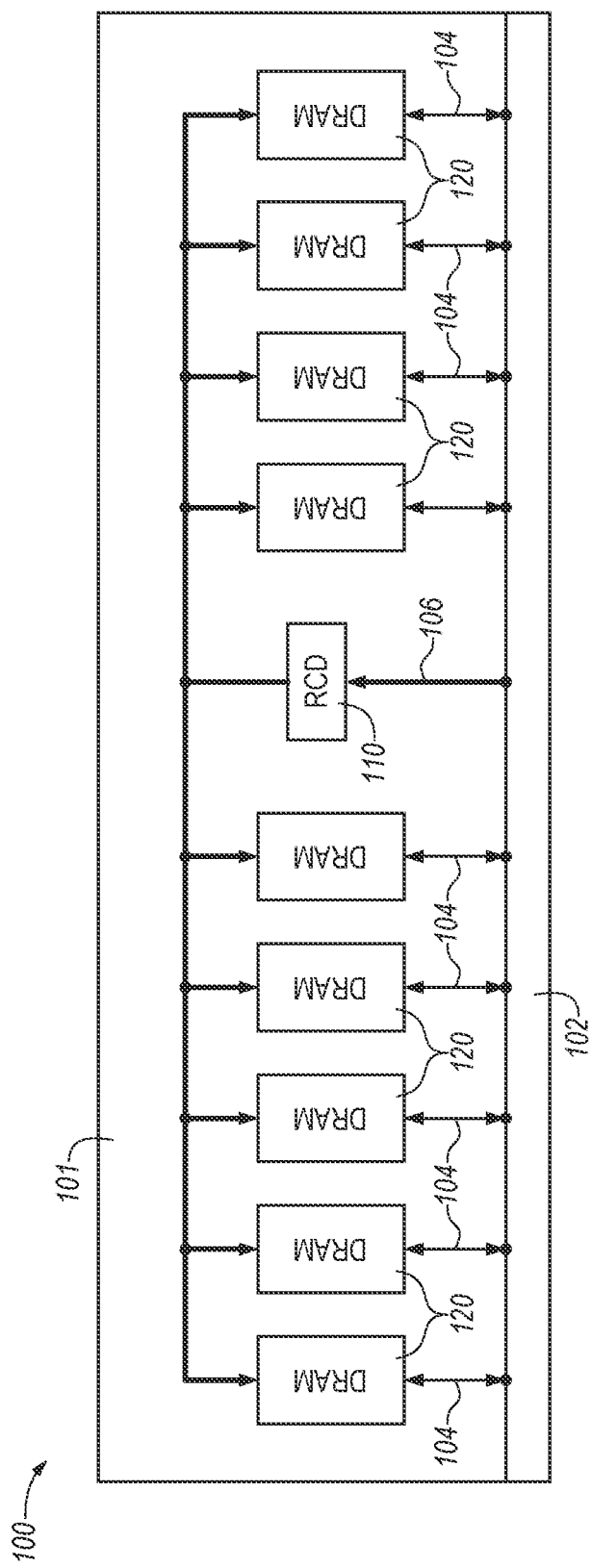
FIG. 1 is a schematic diagram of a volatile memory module.

FIG. 1 schematically illustrates a DIMM 100 including a plurality of DRAM memories 120 (e.g., memory dies, memory chips, memory packages or the like). The DIMM 100 includes an edge connector 102 along an edge of a substrate 101 (e.g., a printed circuit board (PCB) or the like) of the DIMM 100 for connecting a data bus 104 and a command/address bus 106 (illustrated in bold lines) to a host device. The data bus 104 connects the DRAM memories 120 to the edge connector 102 and receives data signals from and transmits data signals to a connected host during memory access operations (e.g., reads and writes). The DIMM 100 further includes a registering clock driver (RCD) 110 that receives command/address signals from the command/address bus 106 and generates memory command/address signals for the DRAM memories 120. The RCD 110 can present a predictable electrical load (e.g., for matching impedance, reactance, capacitance, etc.) to the host device and can re-drive memory command/address signals to the DRAM memories 120, which helps enable higher densities and increase signal integrity. The RCD 110 may also buffer the command/address signals provided by the host, and then transmit the buffered signals as memory command/address signals to the DRAM memories 120.

Figure 2:
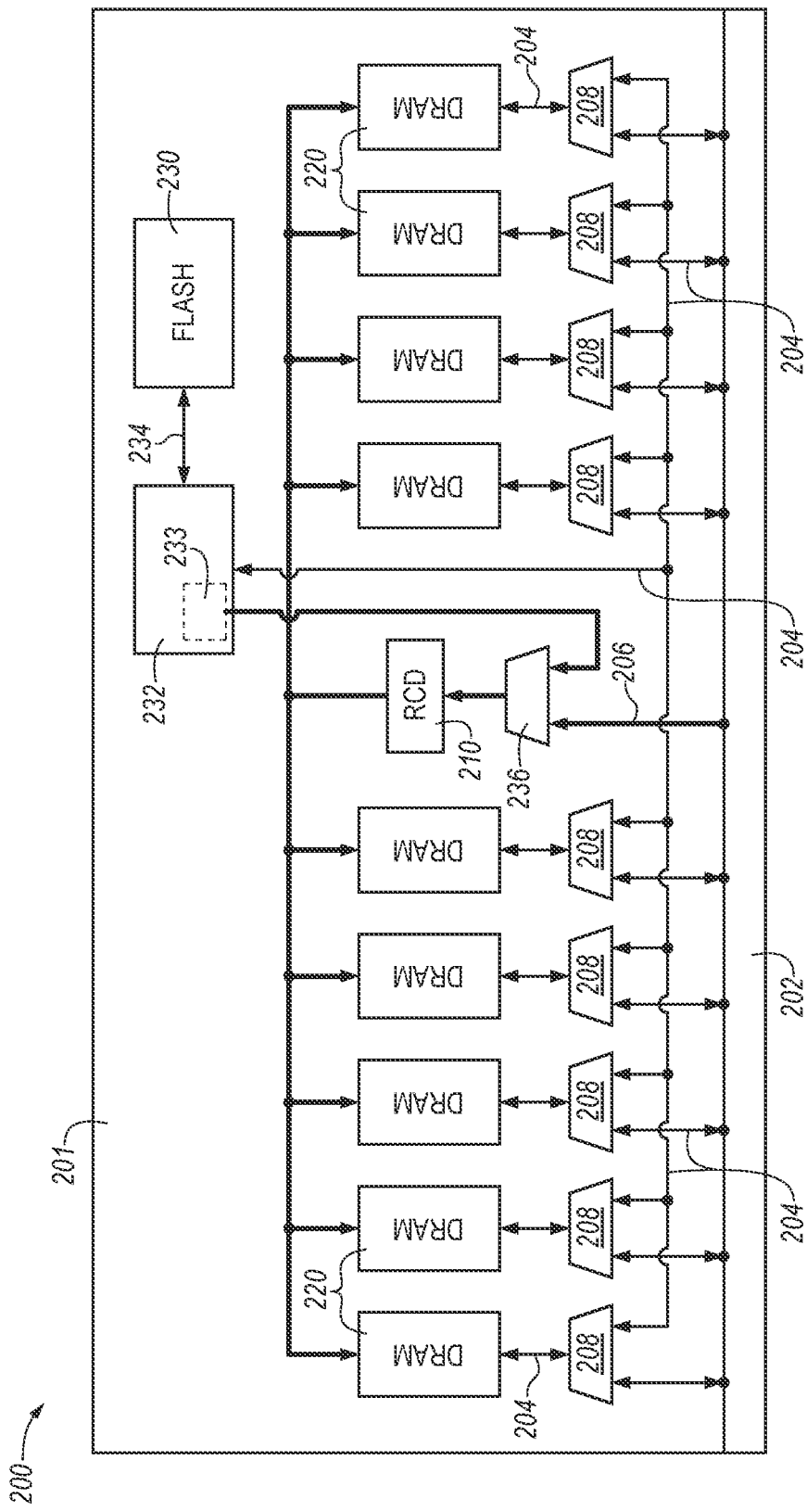
FIG. 2 is a schematic diagram of a non-volatile memory module.

An NVDIMM can be configured similarly to the DIMM 100, with the addition of non-volatile memory and supporting circuitry and devices. One such NVDIMM is illustrated schematically in FIG. 2. NVDIMM 200 includes both a plurality of DRAM memories 220 and a non-volatile memory (e.g., FLASH memory 230). The NVDIMM 200 includes an edge connector 202 along an edge of a substrate 201 (e.g., a PCB or the like) of the NVDIMM 200 for connecting a data bus 204 and a command/address bus 206 (illustrated in bold lines) to a host device. The data bus 204 connects the DRAM memories 220 to the edge connector 202 and receives data signals from and transmits data signals to a connected host during memory access operations (e.g., reads and writes). The NVDIMM 200 further includes a registering clock driver (RCD) 210 that receives command/address signals from the command/address bus 206 and generates memory command/address signals for the DRAM memories 220.

The NVDIMM 200 further includes a controller 232 for controlling the FLASH memory 230 and performing memory management operations, such as power loss detection, backup from the DRAM memories 220 to the non-volatile memory 230, and restore from the FLASH memory 230 to the DRAM memories 220. The controller 232 may include a connection to the edge connector 202 (not shown) to facilitate detection of a power loss event (e.g., by monitoring a voltage of a power supply pin, or via a dedicated pin for sending commands from a connected host to the controller 232).

The controller 232 is connected to the FLASH memory 230 by a non-volatile bus 234 and to the DRAM memories 220 by the data bus 204. In this regard, the data bus 204 may include a number of data multiplexers 208 to facilitate connecting the DRAM memories 220 to both the edge connector 202 (e.g., for receiving data signals from and transmitting data signals to a connected host) and to the controller 232 (e.g., for reading data signals from the DRAM memories 220 during a backup operation and transmitting data signals to the DRAM memories 220 during a restore operation). For example, in an embodiment in which each of nine DRAM memories 220 have eight I/O terminals, the data bus 204 can include eight bus lines connecting each DRAM memory 220 to the corresponding data multiplexer 208, eight bus lines connecting each data multiplexer 208 to the edge connector 202, and eight bus lines connecting each data multiplexer 208 to the controller 232 (e.g., which could be provided with 72 I/O terminals). In another embodiment, a memory module similar to NVDIMM 200 could include a further nine DRAM memories 220 on a back side thereof (for 18 total DRAM memories 220, each having four I/O terminals). In such an embodiment, the data bus 204 could include four bus lines connecting each of the eighteen DRAM memories 220 to a corresponding one of eighteen data multiplexers 208, four bus lines connecting each data multiplexer 208 to the edge connector 202, and four bus lines connecting each data multiplexer 208 to the controller 232 (e.g., which could be provided with 72 I/O terminals).

The controller 232 is further connected to the RCD 210, in order to provide command/address signals to the DRAM memories 220 during backup and restore operations. In this regard, the controller can include a driver 233 for sending command/address signals to the RCD 210, through a command/address multiplexer 236 configured to connect the RCD 210 to both the edge connector 202 and the driver 233 of the controller 232. Because the command/address multiplexer 236 of NVDIMM 200 is disposed between the RCD 210 and the edge connector 202 (and thus RCD is not directly connected to edge connector 202 by the command/address bus 206), it can be challenging to ensure that RCD 210 presents a predictable electrical load (e.g., for matching impedance, reactance, capacitance, etc.) to a connected host device.

To facilitate the interchangeability of memory modules conforming to the same standard, it is desirable to provide such modules with the same physical interface (e.g., edge connector design, minimum and maximum physical dimensions, etc.) and electrical interface (e.g., pin layout, circuit impedance, current draw, operating voltage, etc.). One challenge associated with providing non-volatile memory on an NVDIMM, which is designed to the same physical and electrical characteristics of a DIMM, is the challenge of providing a predictable electrical impedance on the command/address bus while accommodating connectivity both to a host device and to an onboard controller. In this regard, matching the impedance of the command/address bus 206 at the edge connector 202 when a command/address multiplexer 236 is provided between the edge connector 202 and the RCD 210 presents a particular challenge, especially as the memory capacity of a NVDIMM module is increased (e.g., by adding more and/or larger DRAM memories).

Accordingly, several embodiments of data storage devices and computing systems in accordance with the present technology can provide memory modules with a multiplexed command/address bus that overcomes the limitations of conventional memory modules. Several embodiments of the present technology are directed to a memory device comprising a first plurality of volatile memories and a non-volatile memory. The memory device further comprises a controller coupled to the non-volatile memory and including a first controller output, and a registering clock driver (RCD) including a first RCD output, and a first multiplexer. The first multiplexer includes a first mux input coupled to the first RCD output, a second mux input coupled to the first controller output, and a first mux output coupled to the first plurality of volatile memories.

Figure 3:
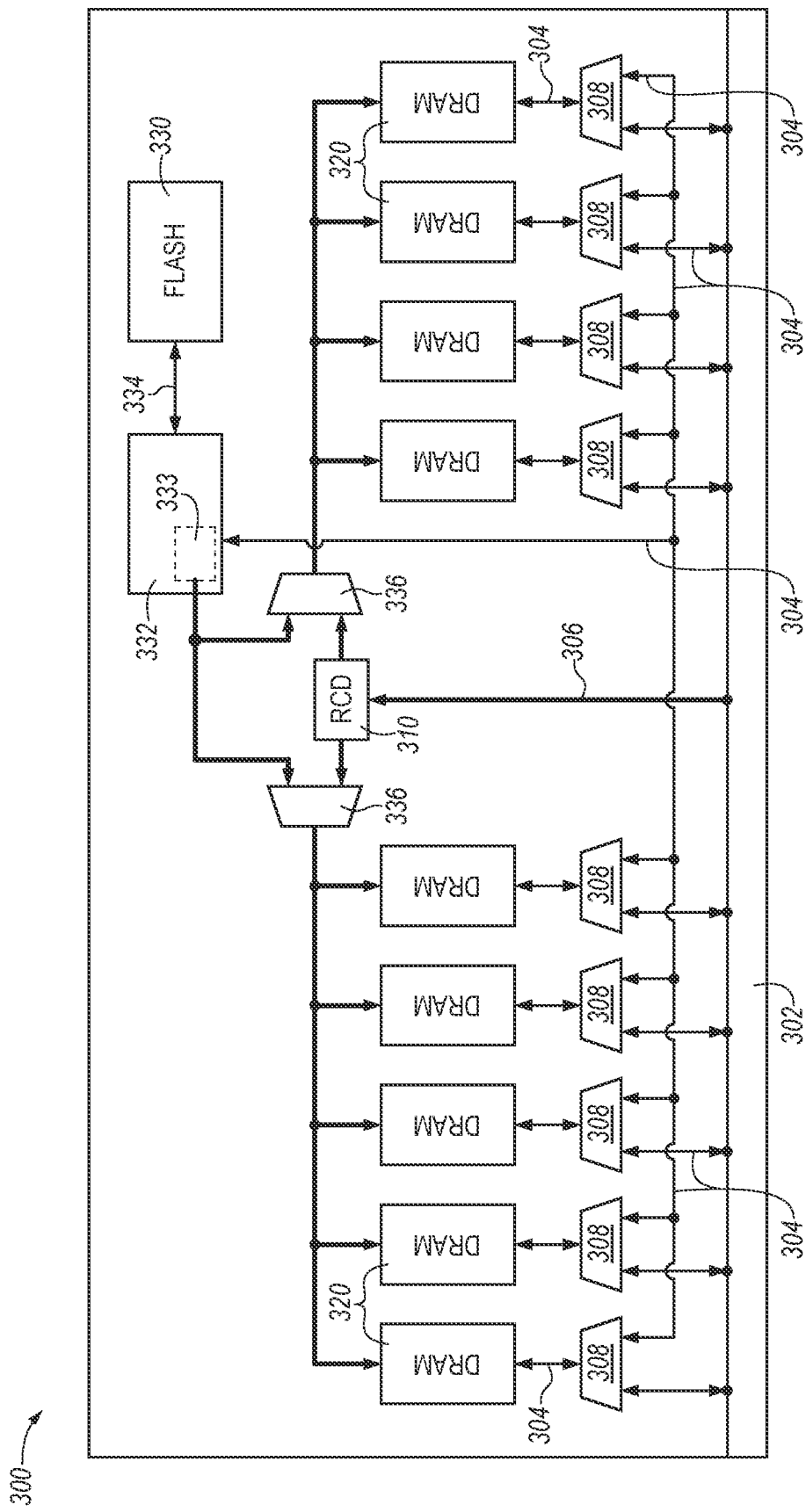
FIG. 3 is a schematic diagram of a memory device in accordance with an embodiment of the present technology.

FIG. 3 is a schematic diagram of a memory device in accordance with an embodiment of the present technology. The memory device 300 may be an NVDIMM, or may have an alternative module format. The memory device 300 includes a plurality of volatile memories 320 (e.g., DRAM memories) and a non-volatile memory 330 (e.g., NAND memory). The memory device 300 includes an external connector (e.g., edge connector 302) for connecting a data bus 304 and a command/address bus 306 (illustrated in bold lines) to a host device. The data bus 304 connects the volatile memories 320 to the edge connector 302 and receives data signals from and transmits data signals to a connected host during memory access operations (e.g., reads and writes). The memory device 300 further includes a registering clock driver (RCD) 310 that receives command/address signals from the command/address bus 306 and generates memory command/address signals for the volatile memories 320. The RCD 310 can present a predictable electrical load (e.g., for matching impedance, reactance, capacitance, etc.) to the host device and can re-drive memory command/address signals to the volatile memories 320, which helps enable higher densities and increase signal integrity. The RCD 310 may also buffer the command/address signals provided by the host, and then transmit the buffered signals as memory command/address signals to the volatile memories 320.

The memory device 300 further includes a controller 332 for controlling the non-volatile memory 330 and performing memory management operations, such as power loss detection, backup from the volatile memories 320 to the non-volatile memory 330, and restore from the non-volatile memory 330 to the volatile memories 320. The controller 332 may include a connection to the edge connector 302 (not shown) to facilitate detection of a power loss event (e.g., by monitoring a voltage of a power supply pin, or via a dedicated pin for sending commands from a connected host to the controller 332).

The controller 332 can be a microcontroller, special purpose logic circuitry (e.g., a field programmable gate array (FPGA), an application specific integrated circuit (ASIC), etc.), or other suitable processor. The controller 332 can include a processor configured to execute instructions stored in memory (e.g., embedded memory in the controller 332 to store instructions for various processes, logic flows, and routines).

The controller 332 is connected to the non-volatile memory 330 by a non-volatile bus 334 and to the volatile memories 320 by the data bus 304. In this regard, the data bus 304 may include a number of data multiplexers 308 to facilitate connecting the volatile memories 320 to both the edge connector 302 (e.g., for receiving data signals from and transmitting data signals to a connected host) and to the controller 332 (e.g., for reading data signals from the volatile memories 320 during a backup operation and transmitting data signals to the volatile memories 320 during a restore operation). For example, in an embodiment in which each of nine DRAM memories 320 have eight I/O terminals, the data bus 304 can include eight bus lines connecting each DRAM memory 320 to the corresponding data multiplexer 308, eight bus lines connecting each data multiplexer 308 to the edge connector 302, and eight bus lines connecting each data multiplexer 308 to the controller 332 (e.g., which could be provided with 72 I/O terminals). In another embodiment, a memory module similar to NVDIMM 300 could include a further nine DRAM memories 320 on a back side thereof (for 18 total DRAM memories 320, each having four I/O terminals). In such an embodiment, the data bus 304 could include four bus lines connecting each of the eighteen DRAM memories 320 to a corresponding one of eighteen data multiplexers 308, four bus lines connecting each data multiplexer 308 to the edge connector 302, and four bus lines connecting each data multiplexer 308 to the controller 332 (e.g., which could be provided with 72 I/O terminals).

The controller 332 is further connected to the volatile memories 320 so that the controller 332 can provide memory command/address signals to the volatile memories 320 during backup and restore operations. In this regard, the controller can include a driver 333 for sending memory command/address signals to the volatile memories 320. Rather than providing command/address signals to the RCD 310, however, as in the NVDIMM illustrated in FIG. 2, the controller 332 of memory device 300 is configured to provide memory command/address signals to the volatile memories 320 through two memory command/address multiplexers 336, which are configured to route memory command/address signals to the volatile memories 320 from both the driver 333 of controller 332 and the outputs of the RCD 310. Accordingly, the driver 333 of controller 332 may be configured to drive the memory command/address signals at one or more levels specified by the design of the volatile memories 320 (e.g., instead of at a level specified by the design of RCD 310).

Figure 4:
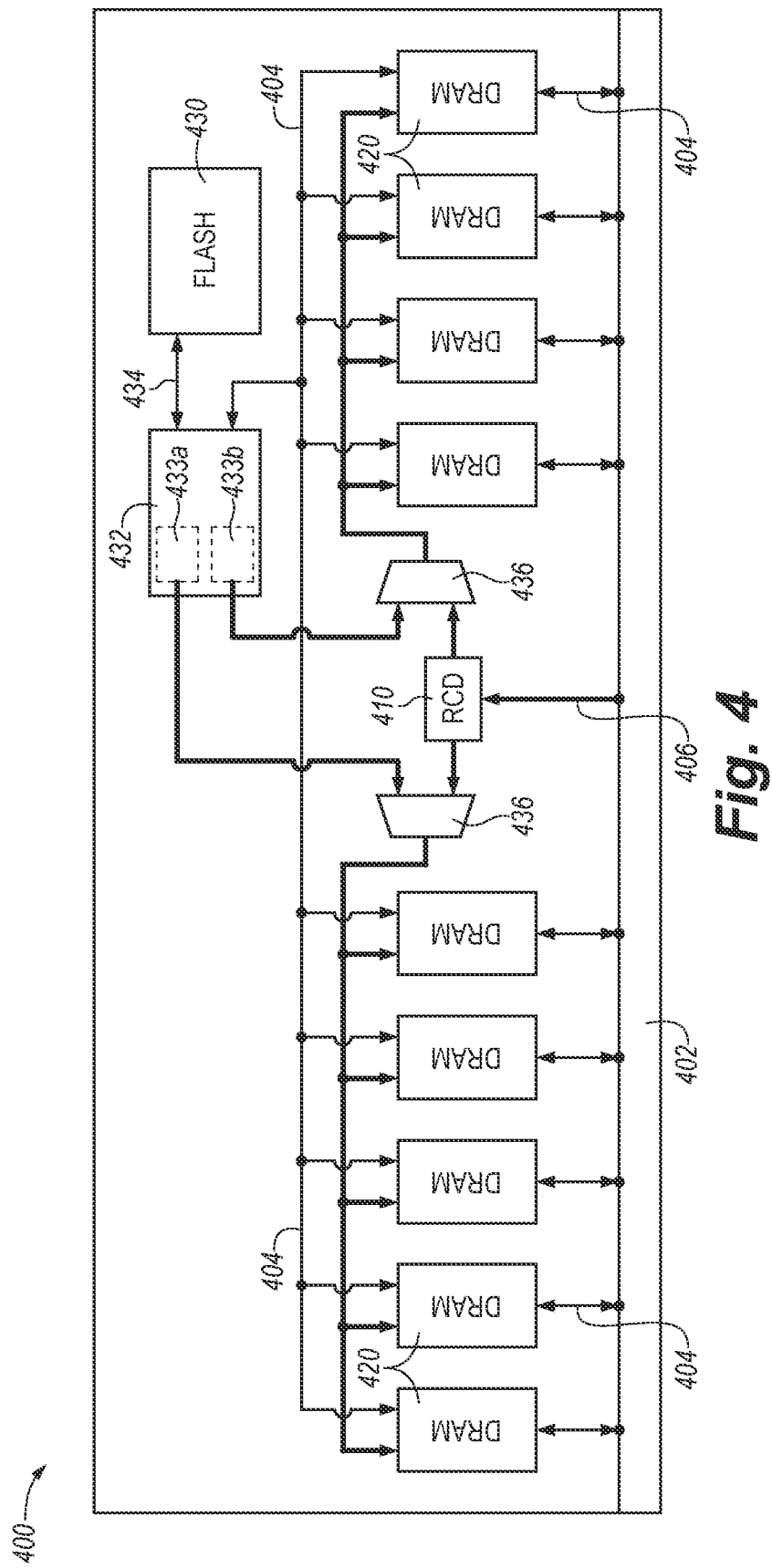
FIG. 4 is a schematic diagram of a memory device in accordance with an embodiment of the present technology.

Although in the embodiment illustrated in FIG. 3, controller 332 is shown as including a single driver 333 for providing command/address signals to all of the volatile memories 320 of the memory device 300, in other embodiments a controller can have multiple drivers. For example, FIG. 4 is a schematic diagram of a memory device in accordance with an embodiment of the present technology. The memory device 400 may be an NVDIMM, or have another alternative module format. The memory device 400 includes a plurality of volatile memories 420 (e.g., DRAM memories) and a non-volatile memory 430 (e.g., NAND memory). The memory device 400 includes an edge connector 402 for connecting a data bus 404 and a command/address bus 406 (illustrated in bold lines) to a host device. The data bus 404 connects the volatile memories 420 to the edge connector 402 and receives data signals from and transmits data signals to a connected host during memory access operations (e.g., reads and writes). The memory device 400 further includes a registering clock driver (RCD) 410 that receives command/address signals from the command/address bus 406 and generates memory command/address signals for the volatile memories 420. The RCD 410 can present a predictable electrical load (e.g., for matching impedance, reactance, capacitance, etc.) to the host device and can re-drive memory command/address signals to the volatile memories 420, which helps enable higher densities and increase signal integrity. The RCD 410 may also buffer the command/address signals provided by the host, and then transmit the buffered signals as memory command/address signals to the volatile memories 420.

The memory device 400 further includes a controller 432 for controlling the non-volatile memory 430 and performing memory management operations, such as power loss detection, backup from the volatile memories 420 to the non-volatile memory 430, and restore from the non-volatile memory 430 to the volatile memories 420. The controller 432 may include a connection to the edge connector 402 (not shown) to facilitate detection of a power loss event (e.g., by monitoring a voltage of a power supply pin, or via a dedicated pin for sending commands from a connected host to the controller 432).

The controller 432 is connected to the non-volatile memory 430 by a non-volatile bus 434 and to the volatile memories 420 by the data bus 404. For simplicity's sake, the memory device 400 of FIG. 4 is illustrated schematically with separate data buses coupling the volatile memories 420 to the edge connector 402 and to the controller 432 (e.g., an embodiment in which each volatile memory 420 includes an internal DQ mux, with four DQ nets coupled by the data bus 404 to the edge connector 402, and four DQ nets coupled by the data bus 404 to the controller 432, switched via a mode register setting in the volatile memory 420), those of skill in the art will readily appreciate that different data bus configurations can be used. The controller 432 is further connected to the volatile memories 420 so that the controller 432 can provide memory command/address signals to the volatile memories 420 during backup and restore operations. In this regard, the controller can include multiple drivers 433a and 433b for sending memory command/address signals to the volatile memories 420. As compared to an embodiment with a single driver, providing multiple drivers can improve the signal integrity of the command/address signals due to the reduced load per driver (albeit at a potentially higher cost and/or complexity). The controller 432 is configured to provide memory command/address signals to the volatile memories 420 through two memory command/address multiplexers 436, which are configured to route memory command/address signals to the volatile memories 420 from both the corresponding driver 433a or 433b of controller 432 and the outputs of the RCD 410. Accordingly, the drivers 433a and 433b of controller 432 may be configured to drive the memory command/address signals at one or more levels specified by the design of the volatile memories 420 (e.g., instead of at a level specified by the design of RCD 410).

Figure 5:
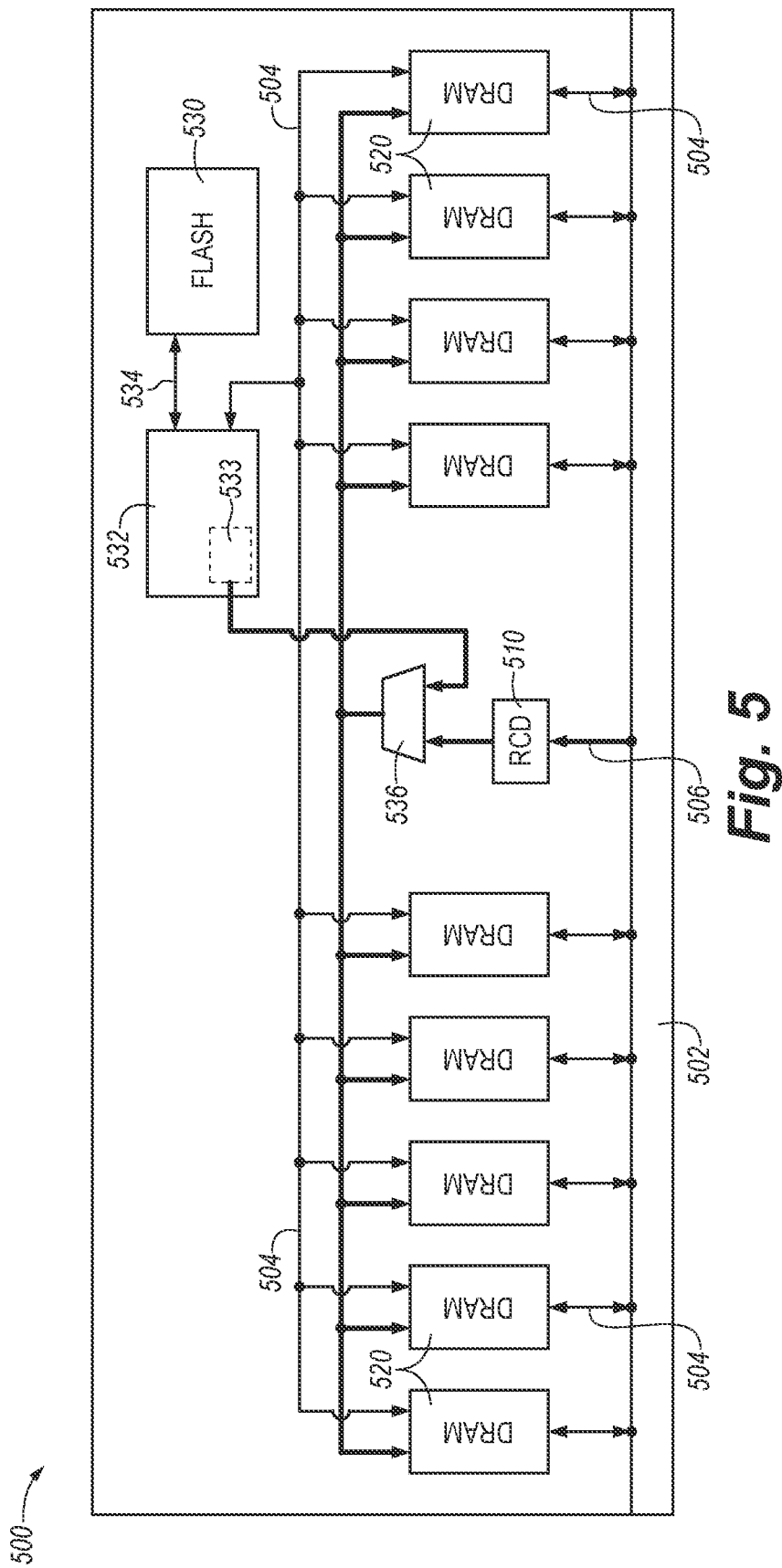
FIG. 5 is a schematic diagram of a memory device in accordance with an embodiment of the present technology.

Although in the foregoing embodiments, memory devices having RCDs with multiple outputs are shown, in other embodiments an RCD can have other numbers of outputs. For example, FIG. 5 is a schematic diagram of a memory device in accordance with an embodiment of the present technology, in which an RCD with a single output is provided. The memory device 500 may be an NVDIMM, or have another alternative module format. The memory device 500 includes a plurality of volatile memories 520 (e.g., DRAM memories) and a non-volatile memory 530 (e.g., NAND memory). The memory device 500 includes an edge connector 502 for connecting a data bus 504 and a command/address bus 506 (illustrated in bold lines) to a host device. The data bus 504 connects the volatile memories 520 to the edge connector 502 and receives data signals from and transmits data signals to a connected host during memory access operations (e.g., reads and writes). The memory device 500 further includes a registering clock driver (RCD) 510 that receives command/address signals from the command/address bus 506 and generates memory command/address signals for the volatile memories 520. The RCD 510 can present a predictable electrical load (e.g., for matching impedance, reactance, capacitance, etc.) to the host device and can re-drive memory command/address signals to the volatile memories 520, which helps enable higher densities and increase signal integrity. The RCD 510 may also buffer the command/address signals provided by the host, and then transmit the buffered signals as memory command/address signals to the volatile memories 520.

The memory device 500 further includes a controller 532 for controlling the non-volatile memory 530 and performing memory management operations, such as power loss detection, backup from the volatile memories 520 to the non-volatile memory 530, and restore from the non-volatile memory 530 to the volatile memories 520. The controller 532 may include a connection to the edge connector 502 (not shown) to facilitate detection of a power loss event (e.g., by monitoring a voltage of a power supply pin, or via a dedicated pin for sending commands from a connected host to the controller 532).

The controller 532 is connected to the non-volatile memory 530 by a non-volatile bus 534 and to the volatile memories 520 by the data bus 504. For simplicity's sake, the memory device 500 of FIG. 5 is illustrated schematically with separate data buses coupling the volatile memories 520 to the edge connector 502 and to the controller 532, those of skill in the art will readily appreciate that different data bus configurations can be used. The controller 532 is further connected to the volatile memories 520 so that the controller 532 can provide memory command/address signals to the volatile memories 520 during backup and restore operations. In this regard, the controller can include a driver 533 for sending memory command/address signals to the volatile memories 520. The controller 532 is configured to provide memory command/address signals to the volatile memories 520 through a memory command/address multiplexer 536, which is configured to route memory command/address signals to the volatile memories 520 from both the driver 533 of controller 532 and the outputs of the RCD 510. Accordingly, the driver 533 of controller 532 may be configured to drive the memory command/address signals at one or more levels specified by the design of the volatile memories 520 (e.g., instead of at a level specified by the design of RCD 510).

Figure 6:
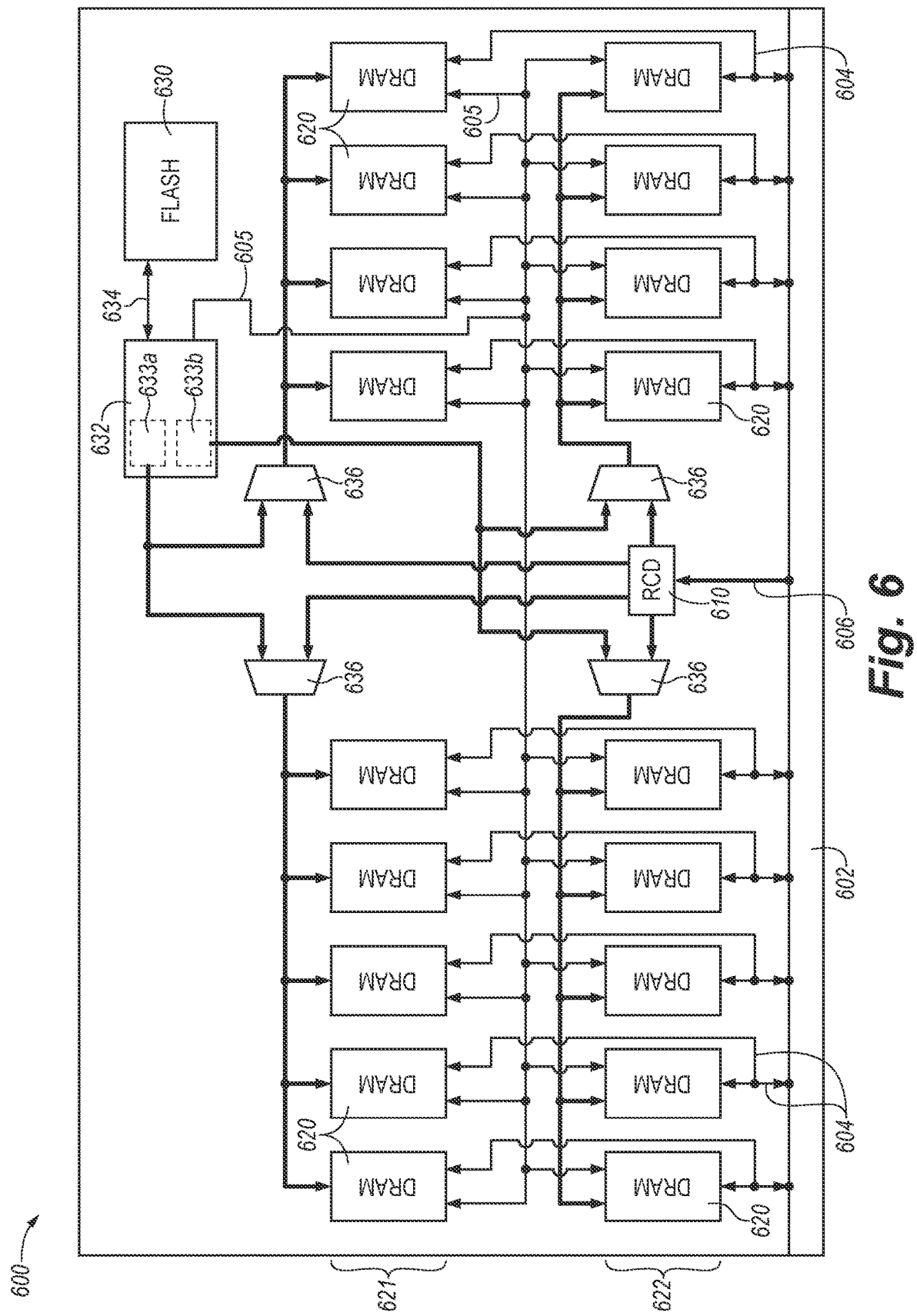
FIG. 6 is a schematic diagram of a memory device in accordance with an embodiment of the present technology.

Although in the foregoing embodiments, memory devices having a single rank of volatile memories are shown, in other embodiments a memory device can have multiple ranks of memories. For example, FIG. 6 is a schematic diagram of a memory device having two ranks of memory in accordance with an embodiment of the present technology. The memory device 600 may be an NVDIMM, or have another alternative module format. The memory device 600 includes a plurality of volatile memories 620 (e.g., DRAM memories) arranged in two ranks 621 and 622, as well as a non-volatile memory 630 (e.g., NAND memory). The memory device 600 includes an edge connector 602 for connecting a first data bus 604 and a command/address bus 606 (illustrated in bold lines) to a host device. The edge connector 602 may include additional connections for separately controlling the two ranks 621 and 622 of memory (e.g., via two chip select terminals to provide a chip select signal to the memory device 600 in order to enable the desired rank).

The first data bus 604 connects the volatile memories 620 to the edge connector 602 and receives data signals from and transmits data signals to a connected host during memory access operations (e.g., reads and writes). The memory device 600 further includes a registering clock driver (RCD) 610 that receives command/address signals from the command/address bus 606 and generates memory command/address signals for the volatile memories 620. The RCD 610 can present a predictable electrical load (e.g., for matching impedance, reactance, capacitance, etc.) to the host device and can re-drive memory command/address signals to the volatile memories 620, which helps enable higher densities and increase signal integrity. The RCD 610 may also buffer the command/address signals provided by the host, and then transmit the buffered signals as memory command/address signals to the volatile memories 620.

The memory device 600 further includes a controller 632 for controlling the non-volatile memory 630 and performing memory management operations, such as power loss detection, backup from the volatile memories 620 to the non-volatile memory 630, and restore from the non-volatile memory 630 to the volatile memories 620. The controller 632 may include a connection to the edge connector 602 (not shown) to facilitate detection of a power loss event (e.g., by monitoring a voltage of a power supply pin, or via a dedicated pin for sending commands from a connected host to the controller 632).

The controller 632 is connected to the non-volatile memory 630 by a non-volatile bus 634 and to the volatile memories 620 by a second data bus 605. In this regard, although the memory device 600 of FIG. 6 is illustrated schematically with separate data buses coupling the volatile memories 620 to the edge connector 602 and to the controller 632 (e.g., an embodiment in which each volatile memory 620 includes an internal DQ mux, with first DQ nets coupled by the first data bus 604 to the edge connector 602, and second DQ nets coupled by the second data bus 605 to the controller 632, switched via a mode register setting in the volatile memory 620), those of skill in the art will readily appreciate that different data bus configurations can be used. The controller 632 is further connected to the volatile memories 620 so that the controller 632 can provide memory command/address signals to the volatile memories 620 during backup and restore operations. In this regard, the controller can include multiple drivers 633a and 633b for sending memory command/address signals to the volatile memories 620 (e.g., driver 633a sending memory command/address signals to rank 621 of the volatile memories 620 and driver 633b sending memory command/address signals to rank 622 of the volatile memories 620). The controller 632 is configured to provide memory command/address signals to the volatile memories 620 through four memory command/address multiplexers 636, which are configured to route memory command/address signals to the volatile memories 620 from both the drivers 633a and 633b of controller 632 and the outputs of the RCD 610. Accordingly, the drivers 633a and 633b of controller 632 may be configured to drive the memory command/address signals at one or more levels specified by the design of the volatile memories 620 (e.g., instead of at a level specified by the design of RCD 610).

Figure 7:
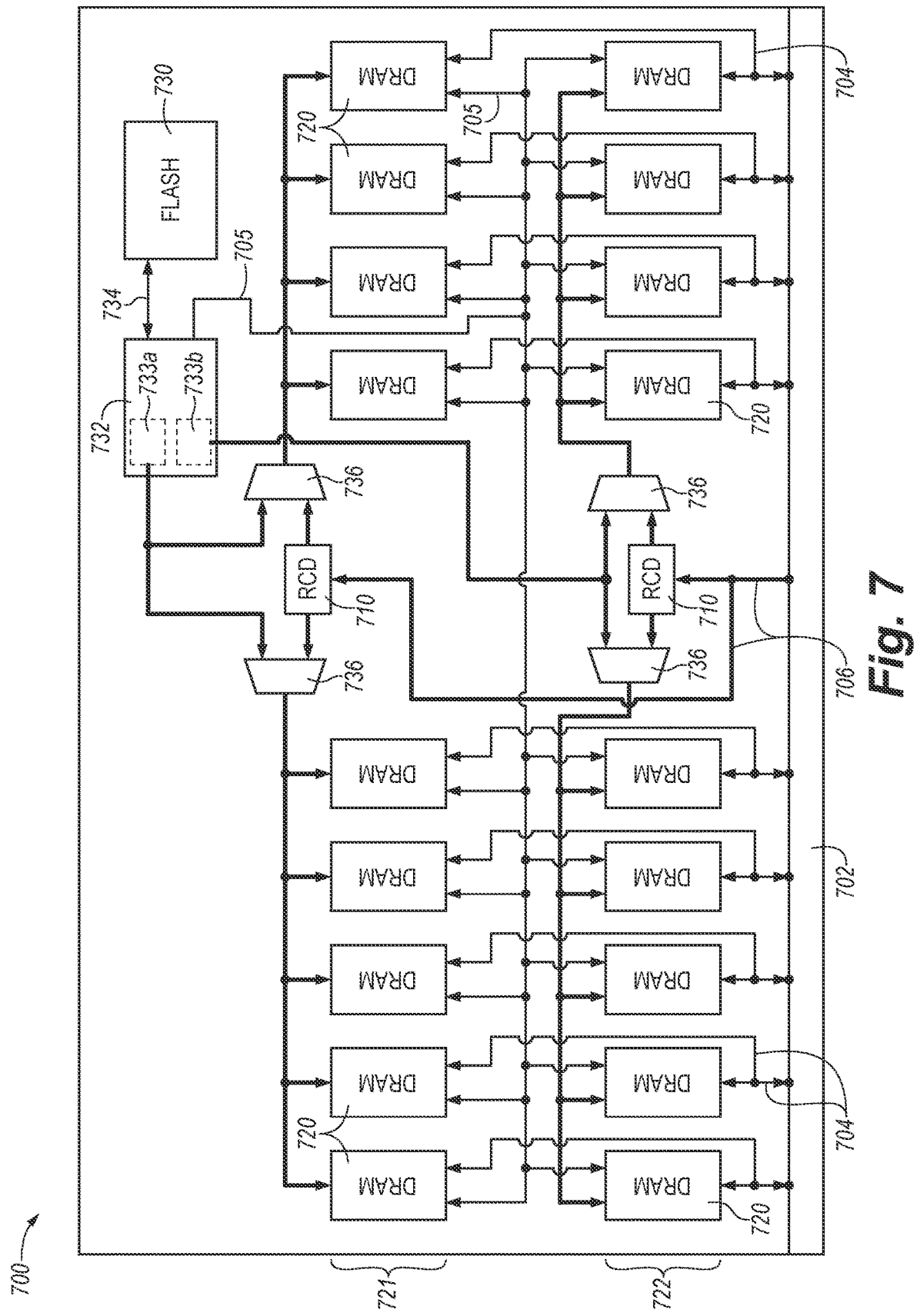
FIG. 7 is a schematic diagram of a memory device in accordance with an embodiment of the present technology.

Although in the foregoing embodiments, memory devices having a single RCD are shown, in other embodiments a memory device can have multiple RCDs. For example, FIG. 7 is a schematic diagram of a memory device in accordance with an embodiment of the present technology. The memory device 700 may be an NVDIMM, or have another alternative module format. The memory device 700 includes a plurality of volatile memories 720 (e.g., DRAM memories) arranged in two ranks 721 and 722, as well as a non-volatile memory 730 (e.g., NAND memory). The memory device 700 includes an edge connector 702 for connecting a first data bus 704 and a command/address bus 706 (illustrated in bold lines) to a host device. The edge connector 702 may include additional connections for separately controlling the two ranks 721 and 722 of memory (e.g., via two chip select terminals to provide a chip select signal to the memory device 700 in order to enable the desired rank).

The first data bus 704 connects the volatile memories 720 to the edge connector 702 and receives data signals from and transmits data signals to a connected host during memory access operations (e.g., reads and writes). The memory device 700 further includes two registering clock drivers (RCD) 710 that receive command/address signals from the command/address bus 706 and generate memory command/address signals for the volatile memories 720. The RCDs 710 can present a predictable electrical load (e.g., for matching impedance, reactance, capacitance, etc.) to the host device and can re-drive memory command/address signals to the volatile memories 720, which helps enable higher densities and increase signal integrity. The RCDs 710 may also buffer the command/address signals provided by the host, and then transmit the buffered signals as memory command/address signals to the volatile memories 720.

The memory device 700 further includes a controller 732 for controlling the non-volatile memory 730 and performing memory management operations, such as power loss detection, backup from the volatile memories 720 to the non-volatile memory 730, and restore from the non-volatile memory 730 to the volatile memories 720. The controller 732 may include a connection to the edge connector 702 (not shown) to facilitate detection of a power loss event (e.g., by monitoring a voltage of a power supply pin, or via a dedicated pin for sending commands from a connected host to the controller 732).

The controller 732 is connected to the non-volatile memory 730 by a non-volatile bus 734 and to the volatile memories 720 by a second data bus 705. In this regard, although the memory device 700 of FIG. 7 is illustrated schematically with separate data buses coupling the volatile memories 720 to the edge connector 702 and to the controller 732 (e.g., an embodiment in which each volatile memory 720 includes an internal DQ mux, with first DQ nets coupled by the first data bus 704 to the edge connector 702, and second DQ nets coupled by the second data bus 705 to the controller 732, switched via a mode register setting in the volatile memory 720), those of skill in the art will readily appreciate that different data bus configurations can be used. The controller 732 is further connected to the volatile memories 720 so that the controller 732 can provide memory command/address signals to the volatile memories 720 during backup and restore operations. In this regard, the controller can include multiple drivers 733*a* and 733*b* for sending memory command/address signals to the volatile memories 720 (e.g., driver 733*a* sending memory command/address signals to rank 721 of the volatile memories 720 and driver 733*b* sending memory command/address signals to rank 722 of the volatile memories 720). The controller 732 is configured to provide memory command/address signals to the volatile memories 720 through four memory command/address multiplexers 736, which are configured to route memory command/address signals to the volatile memories 720 from both the drivers 733*a* and 733*b* of controller 732 and the outputs of the RCD 710. Accordingly, the drivers 733*a* and 733*b* of controller 732 may be configured to drive the memory command/address signals at one or more levels specified by the design of the volatile memories 720 (e.g., instead of at a level specified by the design of RCD 710).

Although in the foregoing exemplary embodiments, memory devices with DRAM-format volatile memory are illustrated, those of skill in the art will readily appreciate that other volatile memory formats can be provided on a memory device similarly configured. For example, a memory device using any one of, or any combination of, DRAM, SRAM, ZRAM, thyristor-RAM or the like could be provided in alternative embodiments of the present technology.

Although in the foregoing exemplary embodiments, memory devices with NAND-format non-volatile memory are illustrated, those of skill in the art will readily appreciate that other non-volatile memory formats can be provided on a memory device similarly configured. For example, a memory device using any one of, or any combination of, NAND, NOR, PCM, MRAM, FeRAM, ReRAM or the like could be provided in alternative embodiments of the present technology.

Figure 8:
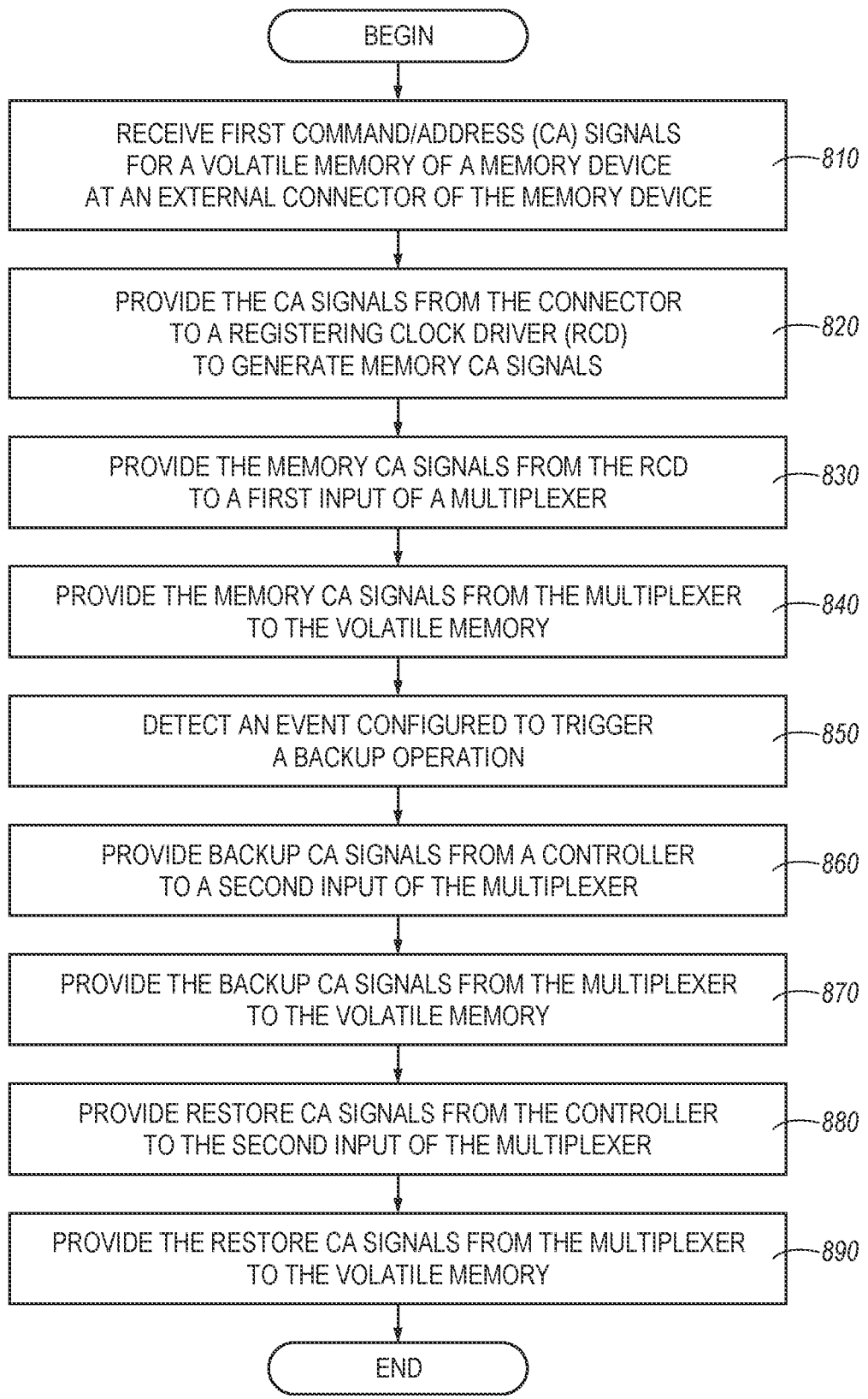
FIG. 8 is a flow chart illustrating a method of operating a memory device in accordance with an embodiment of the present technology.

FIG. 8 is a flow chart illustrating a method of operating a memory device in accordance with an embodiment of the present technology. The method includes receiving, at a connector of the memory device, command/address signals for a volatile memory of the memory device (box 810). The method further includes providing the command/address signals from the connector to a registering clock driver (RCD) of the memory device to generate memory command/address signals (box 820). The method further includes providing the memory command/address signals from the RCD to a first input of a multiplexer (box 830). The multiplexer can include a second input connected to a non-volatile memory controller of the memory device. The method further includes providing the memory command/address signals from the multiplexer to the volatile memory of the memory device (box 840).

The method can further include detecting an event configured to trigger a backup operation (box 850). The backup operation may include providing backup command/address signals (e.g., including read commands for the volatile memory) from the non-volatile memory controller to the second input of the multiplexer (box 860). In some embodiments, the controller may first instruct the multiplexer to activate the second input of the multiplexer (e.g., and de-select the first input). The backup operation may further include providing (box 870) the backup command/address signals from the multiplexer to the volatile memory (e.g., instructing the volatile memory to read data from the volatile memory onto the data bus). If the volatile memory includes multiple volatile memories, the backup command/address signals may either be directed to the multiple volatile memories serially, simultaneously, or some combination thereof (e.g., to more than one but less than all at a time, such as a right-side-first, left-side-second approach). If the volatile memory includes internal DQ muxes, the controller may include in the backup command/address signals an instruction to select the port(s) coupled by data bus connections to the controller.

The method can further include a restore operation, which may include providing restore command/address signals (e.g., including write commands for the volatile memory) from the non-volatile memory controller to the second input of the multiplexer (box 880). In some embodiments, the controller may first instruct the multiplexer to activate the second input of the multiplexer (e.g., and de-select the first input). The restore operation may further include providing (box 890) the restore command/address signals from the multiplexer to the volatile memory (e.g., instructing the volatile memory to write data from the data bus to the volatile memory). If the volatile memory includes multiple volatile memories, the restore command/address signals may either be directed to the multiple volatile memories serially or simultaneously, or some combination thereof (e.g., to more than one but less than all at a time, such as a right-side-first, left-side-second approach). If the volatile memory includes internal DQ muxes, the controller may include in the restore command/address signals an instruction to select the port(s) coupled by data bus connections to the controller.

From the foregoing, it will be appreciated that specific embodiments of the invention have been described herein for purposes of illustration, but that various modifications may be made without deviating from the scope of the invention. Accordingly, the invention is not limited except as by the appended claims.

What is claimed is:

1. An apparatus, comprising:
   a first plurality of volatile memories;
   a second plurality of volatile memories;
   a non-volatile memory;
   a controller coupled to the non-volatile memory;
   a registering clock driver (RCD) having a first RCD output and a second RCD output;
   a first command/address (C/A) multiplexer including a first C/A mux input coupled to the first RCD output, a second C/A mux input coupled to a first driver of the controller, and a first C/A mux output coupled to the first plurality of volatile memories; and
   a second C/A multiplexer including a third C/A mux input coupled to the second RCD output, a fourth C/A mux input coupled to a second driver of the controller, and a second C/A mux output coupled to the second plurality of volatile memories.

2. The apparatus of claim 1, wherein the RCD has a RCD input coupled to an external connector of the apparatus by a command/address bus.

3. The apparatus of claim 1, wherein the first driver of the controller is configured to generate command/address signals for the first plurality of volatile memories and wherein the second driver of the controller is configured to generate command/address signals for the second plurality of volatile memories.

4. The apparatus of claim 1, wherein the first and second C/A multiplexers are configured to provide command/address signals from either the RCD or the controller to the first and second pluralities of volatile memories, respectively.

5. The apparatus of claim 1, further comprising a backup power source.

6. The apparatus of claim 1, wherein the controller is configured to generate command/address signals to copy data from the first and/or second pluralities of volatile memories to the non-volatile memory upon detecting a loss of power to the apparatus.

7. The apparatus of claim 6, wherein the first and second C/A multiplexers are configured to ignore command/address signals from the RCD upon detecting the loss of power to the apparatus.

8. The apparatus of claim 6, wherein the controller is configured to generate command/address signals to copy data from the non-volatile memory to the first and/or second pluralities of volatile memories upon recovery from the loss of power to the apparatus.

9. An apparatus, comprising:
   a first plurality of volatile memories;
   a second plurality of volatile memories;
   a non-volatile memory;
   a controller coupled to the non-volatile memory;
   a first registering clock driver (RCD);
   a second RCD;
   a first command/address (C/A) multiplexer including a first C/A mux input coupled to an output of the first RCD, a second C/A mux input coupled to a first driver of the controller, and a first C/A mux output coupled to the first plurality of volatile memories; and
   a second C/A multiplexer including a third C/A mux input coupled to an output of the second RCD, a fourth C/A mux input coupled to a second driver of the controller, and a second C/A mux output coupled to the second plurality of volatile memories.

10. The apparatus of claim 9, wherein the first and second RCDs each have an input coupled to an external connector of the apparatus by a command/address bus.

11. The apparatus of claim 9, wherein the first driver of the controller is configured to generate command/address signals for the first plurality of volatile memories and wherein the second driver of the controller is configured to generate command/address signals for the second plurality of volatile memories.

12. The apparatus of claim 9, further comprising a backup power source.

13. The apparatus of claim 9, wherein the controller is configured to generate command/address signals to copy data from the first and/or second pluralities of volatile memories to the non-volatile memory upon detecting a loss of power to the apparatus.

14. The apparatus of claim 9, wherein the controller is configured to generate command/address signals to copy data from the non-volatile memory to the first and/or second pluralities of volatile memories upon recovery from the loss of power to the apparatus.

15. An apparatus, comprising:
   a substrate;
   a connector on the substrate, the connector configured to receive first command/address signals;
   a controller on the substrate, the controller configured to generate second command/address signals;
   at least one registering clock driver (RCD) on the substrate;
   a first plurality of memories on the substrate; and
   a second plurality of memories on the substrate,
   wherein each of the first plurality of memories is configured to receive the first command/address signals from the connector through a first RCD output of the at least one RCD and to receive the second command/address signals from a first driver of the controller without intervening the at least one RCD therebetween, and
   wherein each of the second plurality of memories is configured to receive the first command/address signals from the connector through a second RCD output of the at least one RCD and to receive the second command/address signals from a second driver of the controller without intervening the at least one RCD therebetween.

16. The apparatus of claim 15, further comprising a backup power source.

17. The apparatus of claim 15, wherein the second command/address signals are configured to copy data from the first and/or second pluralities of memories to a third memory on the substrate upon detecting a loss of power to the apparatus.

18. The apparatus of claim 17, wherein the controller is configured to generate command/address signals to copy data from the third memory to the first and/or second pluralities of memories upon recovery from the loss of power to the apparatus.

19. The apparatus of claim 15, wherein the at least one RCD comprises a first RCD including the first RCD output and a second RCD including the second RCD output.

* * * * *